(12) United States Patent
Lin

(10) Patent No.: US 8,764,073 B2
(45) Date of Patent: Jul. 1, 2014

(54) LOCKABLE DOOR STRUCTURE

(75) Inventor: Chun-Ta Lin, Hsinchu (TW)

(73) Assignee: Getac Technology Corporation, Hsinchu County (TW)

(*) Notice: Subject to any disclaimer, the term of this patent is extended or adjusted under 35 U.S.C. 154(b) by 324 days.

(21) Appl. No.: 13/245,472

(22) Filed: Sep. 26, 2011

(65) Prior Publication Data
US 2012/0144749 A1 Jun. 14, 2012

(30) Foreign Application Priority Data

Dec. 10, 2010 (CN) .......................... 2010 1 0592039

(51) Int. Cl.
E05C 1/02 (2006.01)
E05B 17/00 (2006.01)
E05C 1/06 (2006.01)
E05B 65/00 (2006.01)

(52) U.S. Cl.
CPC ................ E05C 1/06 (2013.01); E05B 17/002 (2013.01); E05B 65/0067 (2013.01); Y10S 292/11 (2013.01); Y10S 292/63 (2013.01)
USPC ........... 292/137; 292/145; 292/146; 292/150; 292/DIG. 11; 292/DIG. 63; 361/679.59; 277/637

(58) Field of Classification Search
USPC ........... 312/326, 327, 328, 223.2, 296, 293.2; 361/679.58, 679.57; 292/32, 137, 292/DIG. 11, DIG. 48, DIG. 50, DIG. 63, 292/145–147, 150; 49/394, 501, 503
See application file for complete search history.

(56) References Cited

U.S. PATENT DOCUMENTS

| 4,478,005 | A | * | 10/1984 | Mundschenk | 49/388 |
|---|---|---|---|---|---|
| 4,818,000 | A | * | 4/1989 | Bobrowski | 292/147 |
| 5,918,957 | A | * | 7/1999 | Bovio et al. | 312/223.2 |
| 7,184,262 | B2 | * | 2/2007 | Hsu et al. | 361/679.27 |
| 7,775,354 | B2 | | 8/2010 | Latchford et al. | |
| 7,874,598 | B2 | * | 1/2011 | Chung | 292/163 |
| 7,903,423 | B2 | * | 3/2011 | Yang | 361/732 |
| 8,226,131 | B1 | * | 7/2012 | Bruce et al. | 292/163 |
| 8,505,986 | B2 | * | 8/2013 | Sun | 292/80 |
| 2006/0007647 | A1 | * | 1/2006 | Peng | 361/683 |
| 2006/0043250 | A1 | * | 3/2006 | Farrell | 248/311.2 |
| 2006/0087127 | A1 | * | 4/2006 | Schimmler | 292/137 |
| 2008/0179896 | A1 | * | 7/2008 | Chung | 292/164 |
| 2008/0291641 | A1 | * | 11/2008 | Sheng | 361/726 |
| 2009/0073644 | A1 | * | 3/2009 | Yang | 361/679.4 |
| 2009/0109635 | A1 | * | 4/2009 | Chen et al. | 361/728 |
| 2009/0256364 | A1 | * | 10/2009 | Gadau et al. | 292/128 |
| 2010/0052484 | A1 | * | 3/2010 | Wang et al. | 312/223.2 |
| 2011/0043973 | A1 | * | 2/2011 | Tai | 361/679.01 |
| 2011/0075338 | A1 | * | 3/2011 | Tang et al. | 361/679.4 |
| 2011/0199720 | A1 | * | 8/2011 | Kajiyama et al. | 361/679.01 |
| 2013/0001892 | A1 | * | 1/2013 | Smith et al. | 277/637 |
| 2013/0200768 | A1 | * | 8/2013 | Miura et al. | 312/296 |

* cited by examiner

Primary Examiner — Darnell Jayne
Assistant Examiner — Ryan A Doyle

(57) ABSTRACT

A structure of the lockable door includes a door cover, a first sliding member, a fastening member, and a second sliding member. The door cover is hinged to a case, and can selectively cover an opening of the case. The first sliding member is inserted through the door cover, and can be slidably mounted on one side surface of the door cover. The fastening member is slidably mounted on the other side surface of the door cover, and has at least one protrusion. The first sliding member is inserted through the fastening member, and the first sliding member and the second sliding member are connected to each other. When the first sliding member is in a retaining position, the second sliding member moves to be on the protrusion, and the first sliding member presses the door cover towards the second sliding member, so as to enhance waterproofness.

17 Claims, 19 Drawing Sheets

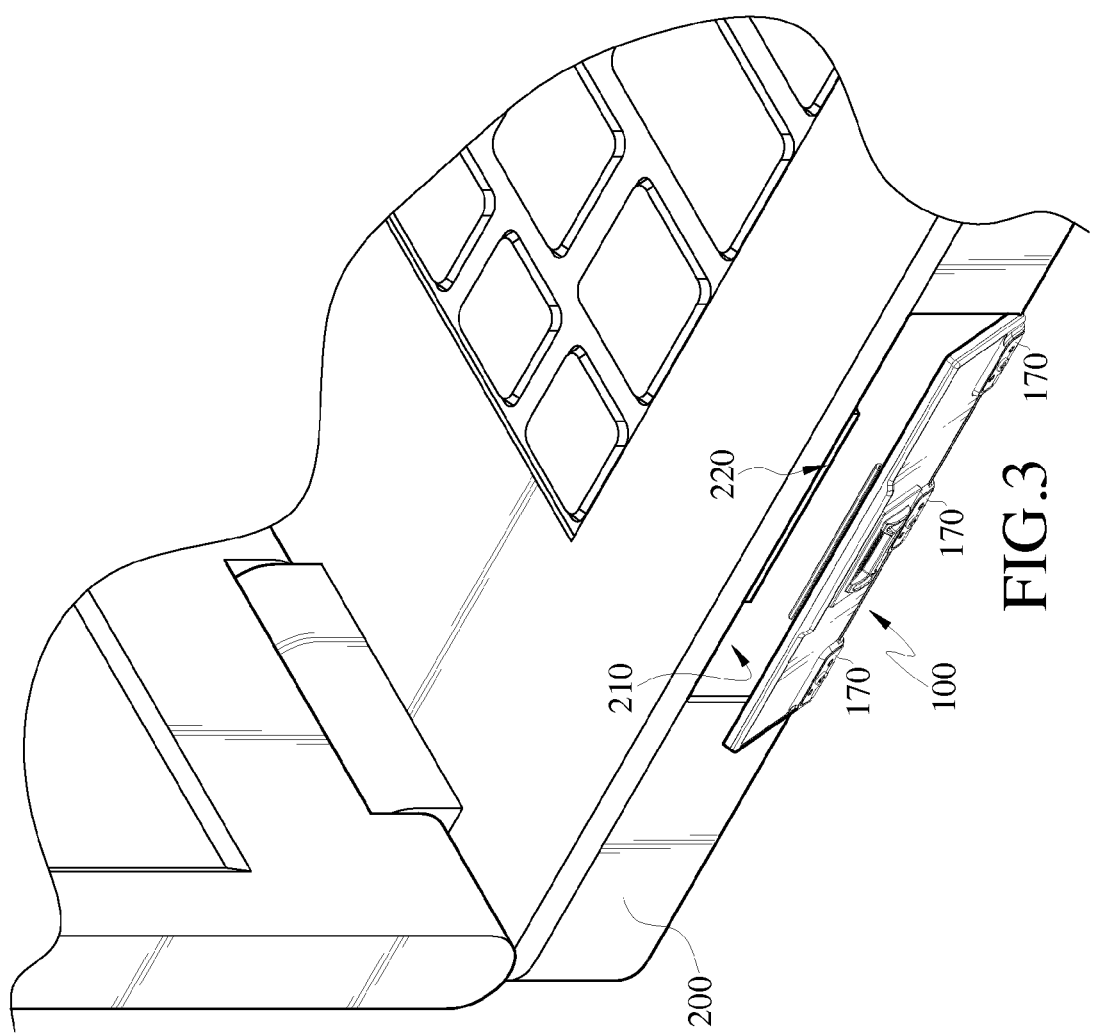

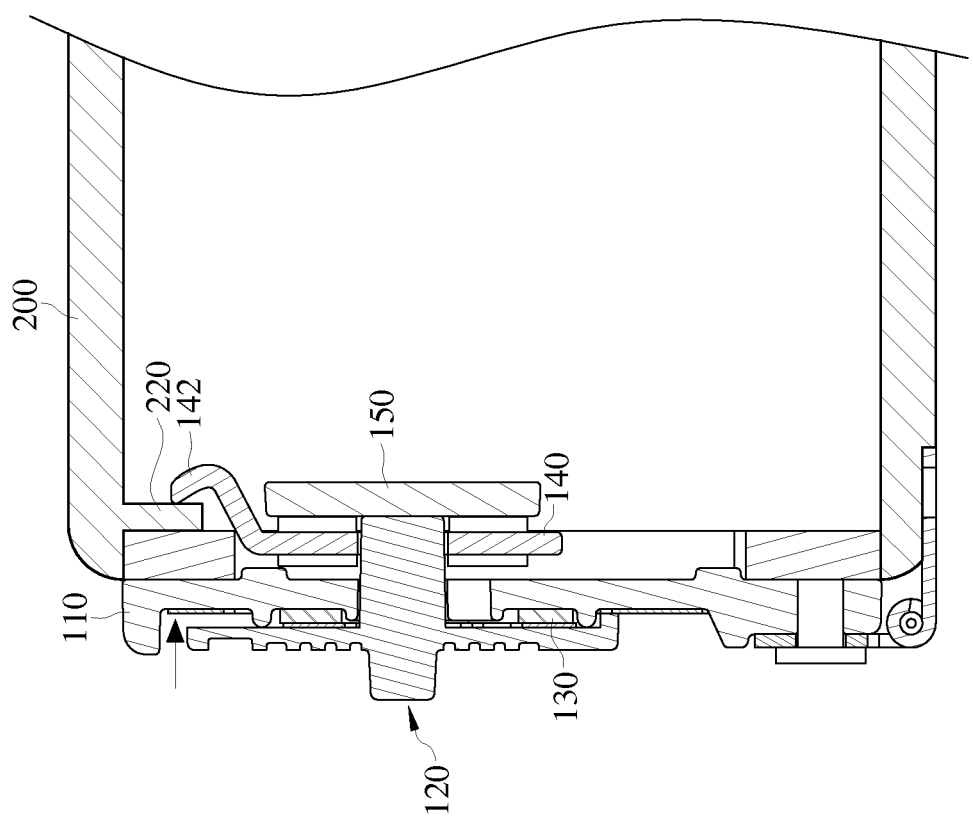

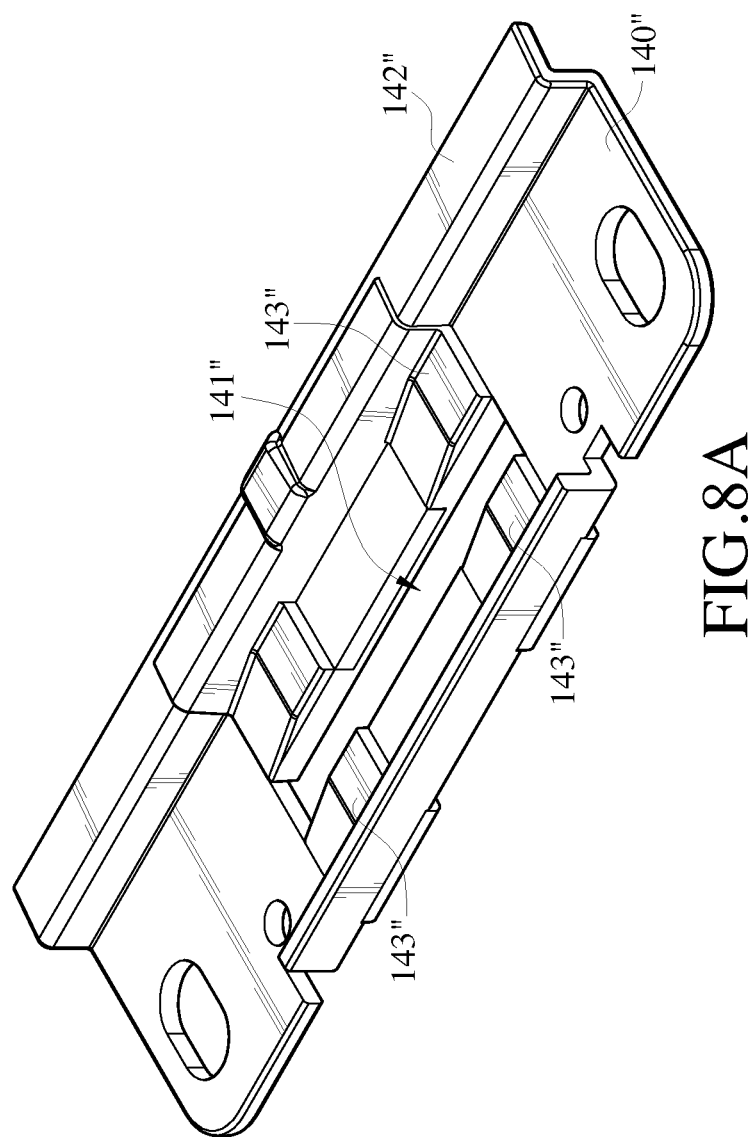

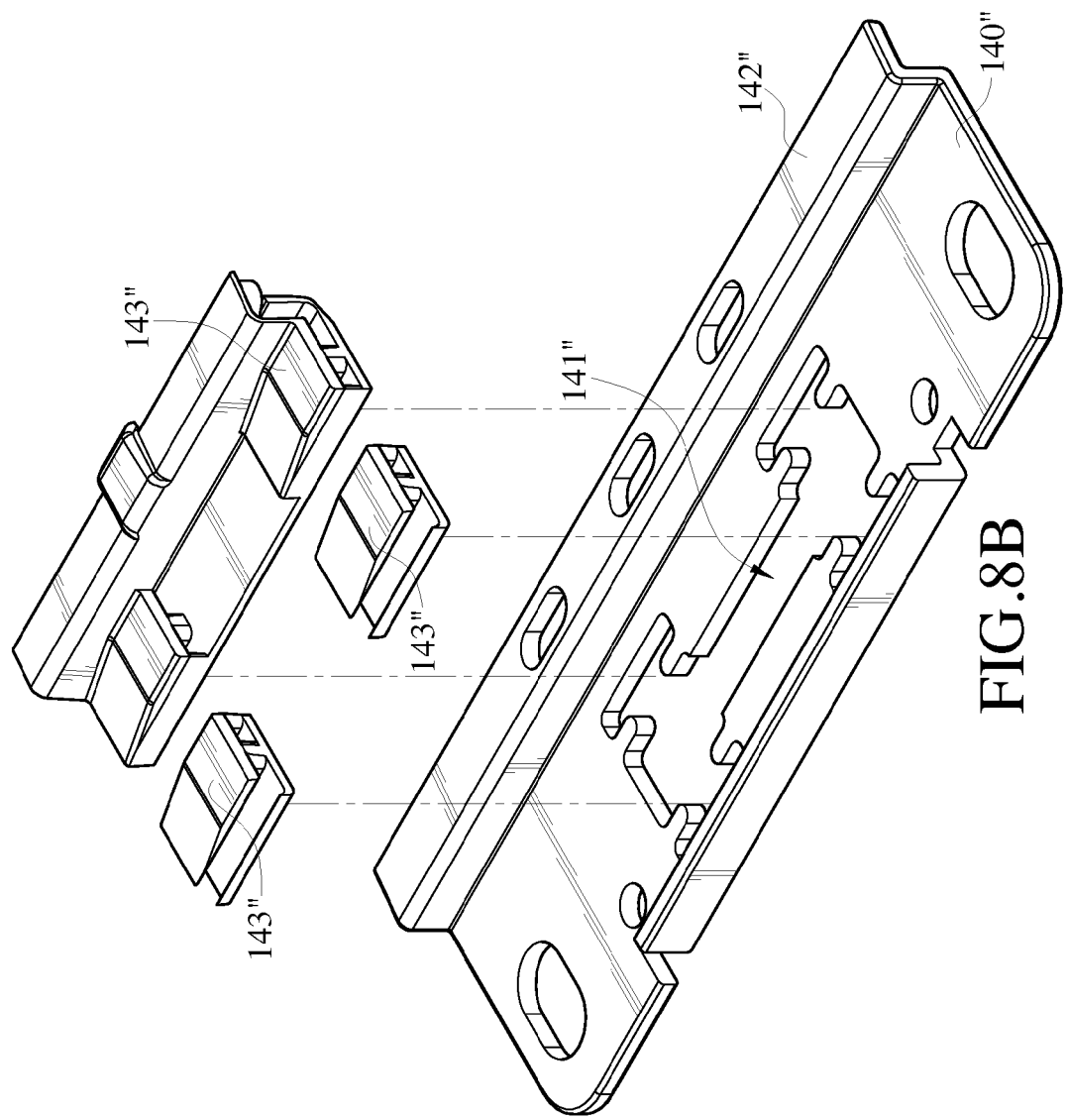

LOCKABLE DOOR STRUCTURE

BACKGROUND OF THE INVENTION

1. Field of the Invention

The present invention relates to a lockable door structure, and more particularly to a lockable door structure applicable to an electronic device, which can selectively cover an opening of a case of the electronic device.

2. Related Art

With the rapid development of the electronic technology, portable notebook computers with high mobility and convenience have gradually become the mainstream of the market. Since the notebook computer is small, and cannot be mounted with too may peripheral devices or connection ports, the notebook computer is usually required to be connected to various external peripheral devices through special expansion slots, so as to be highly applicable and highly extensible as a multifunctional product.

For the above extensible notebook computer, room is reserved inside the case of the mainframe of the notebook computer, so that peripheral hardware devices can be mounted inside the mainframe. The room is connected to the outside through an opening in the surface of the case, so that a user can directly mount or dismount a peripheral hardware device without disassembling the case, thus avoiding the trouble of dissembling the case of the mainframe.

When the notebook computer is used in a harsh and hostile environment, for example, in a case in which a military computer has to be used outdoors for a long period of time, foreign matter, such as dust, dirt, and liquid, has to be prevented from entering into the inside of the notebook computer through the expansion slots. Therefore, a movable door cover structure is designed in most existing notebook computers, so as to cover the expansion slots to make the notebook computer dustproof and waterproof. However, the door cover structure cannot harm convenience of a user using the notebook computer, so that the door cover structure for the dust proofing and the water proofing must take into account of both the convenience of use and the covering effect of preventing the foreign matters from entering.

Since water is in liquid form, water is easier to flow into the inside of the notebook computer as compared with foreign matter of solid form such as the dust. If water enters into the computer device, the water may directly damage electronic components of the computer device. Therefore, how to prevent the water from entering into the inside of the computer device is a major design consideration of research and development personnel.

In the prior art, a common door cover structure is similar to a gate. The gate-type waterproof door cover slides along a direction parallel to a sidewall of the case in a reciprocating manner, and the waterproof door cover can pivot relative to the computer device, so as to expose the expansion slots to the outside selectively. In addition, in order to enhance the waterproof of the door cover structure, in the prior art, a compressible waterproofing layer with friction is disposed between the waterproof door cover and the sidewall of the case, which for example, may be a foam material or a rubber material. The waterproofing layer is pressed tightly within limited room between the waterproof door cover and the case to prevent the water from passing through the room between the waterproof door cover and the case to flow into the inside of the computer device.

Conventionally, the waterproofing layer is usually made of a material with a high friction coefficient, so as to achieve an optimal waterproofing effect. However, high friction of the waterproofing layer also incurs friction to the sliding of the waterproof door cover, so that high friction of the waterproofing layer makes the sliding of the waterproof door cover difficult during opening and closing of the cover. In order to enhance the waterproofness of the door cover, the thickness of the waterproofing layer has to be increased to enhance the contact and an interference force between the waterproofing layer and the door cover, so that the thickness of the waterproofing layer increased makes the sliding of the waterproof door cover harder and results in inconvenience of the operation of the user.

On the contrary, in order to decrease resistance generated during the sliding of the waterproof door cover, the thickness of the waterproofing layer has to be decreased to make it easy for the door cover to slide. However, a distance between the waterproof door cover and the case remains the same, and therefore the waterproofing layer is no longer pressed tightly by the waterproof door cover, thus results in an imperfect waterproofing effect of the waterproof door cover.

SUMMARY OF THE INVENTION

Accordingly, the present invention is a lockable door structure, so as to solve the problem in which a conventional waterproof door cover structure of an electronic device cannot achieve both a good waterproofing effect and operating convenience at the same time.

The present invention provides a lockable door structure, which is disposed on a case. The case has an opening, and the case has a locking rib in a position adjacent to the opening. The lockable door structure comprises a door cover, a first sliding member, a fastening member, and a second sliding member. The door cover is hinged to the case, and corresponds to the opening. The door cover has a first surface and a second surface opposite to each other, and the door cover further has a displacement slot, which runs through the first surface and the second surface.

The first sliding member may be slidably mounted on the first surface of the door cover. The first sliding member is inserted into the displacement slot, and can slide relative to the door cover between a normal position, a release position, and a retaining position. The fastening member may be slidably mounted on the second surface of the door cover, and the fastening member has a sliding slot, a catch portion, and at least one protrusion. The second sliding member may be slidably disposed on the fastening member. The first sliding member runs through the displacement slot and the sliding slot to join the second sliding member. When the first sliding member is in the normal position, the catch portion catches the locking rib, and the second sliding member is located on a lateral side of the protrusion. When the first sliding member moves from the normal position to the release position, the first sliding member moves in the displacement slot, and presses a wall of the sliding slot to make the catch portion depart from the locking rib.

When the first sliding member moves from the release position to the retaining position, the first sliding member moves in the displacement slot to drive the second sliding member to move from the lateral side of the protrusion to be on the protrusion, so that the second sliding member is pressed by the protrusion to drive the first sliding member to press towards the first surface of the door cover.

Beneficial effects of the present invention are as follows. A catch portion of a fastening member is designed, so that when a first sliding member slides to a retaining position, an interference between the first sliding member and a door cover is increased, thus effectively enhancing tightness between the first sliding member and the door cover. When the first sliding member slides between a normal position and a release position, the catch portion does not increase the interference between the first sliding member and the door cover, so that the lockable door structure of the present invention is not only waterproof but also convenient for use.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein:

FIG. 3 is a schematic three-dimensional view of a lockable door structure mounted to a case according to an embodiment of the present invention;

FIG. 6C is a sectional side view of a first sliding member in a retaining position according to an embodiment of the present invention;

FIG. 8A is a schematic structural view of another embodiment of a fastening member according to the present invention; and FIG. 8B is a schematic exploded view of the fastening member in FIG. 8A.

DETAILED DESCRIPTION OF THE INVENTION

Figure 1A:
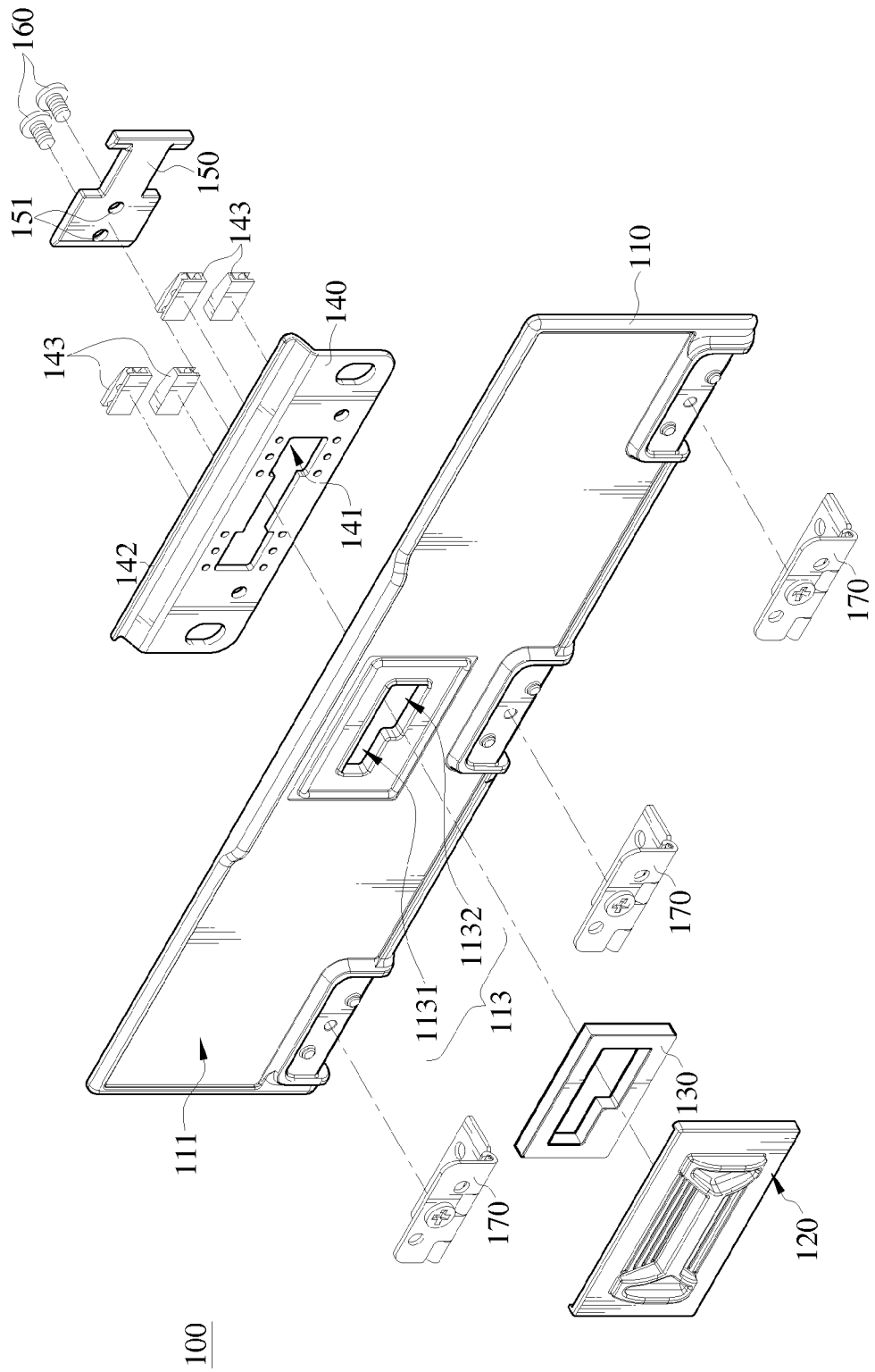
FIG. 1A is a three-dimensional exploded view of a lockable door structure according to an embodiment of the present invention.
Figure 1B:
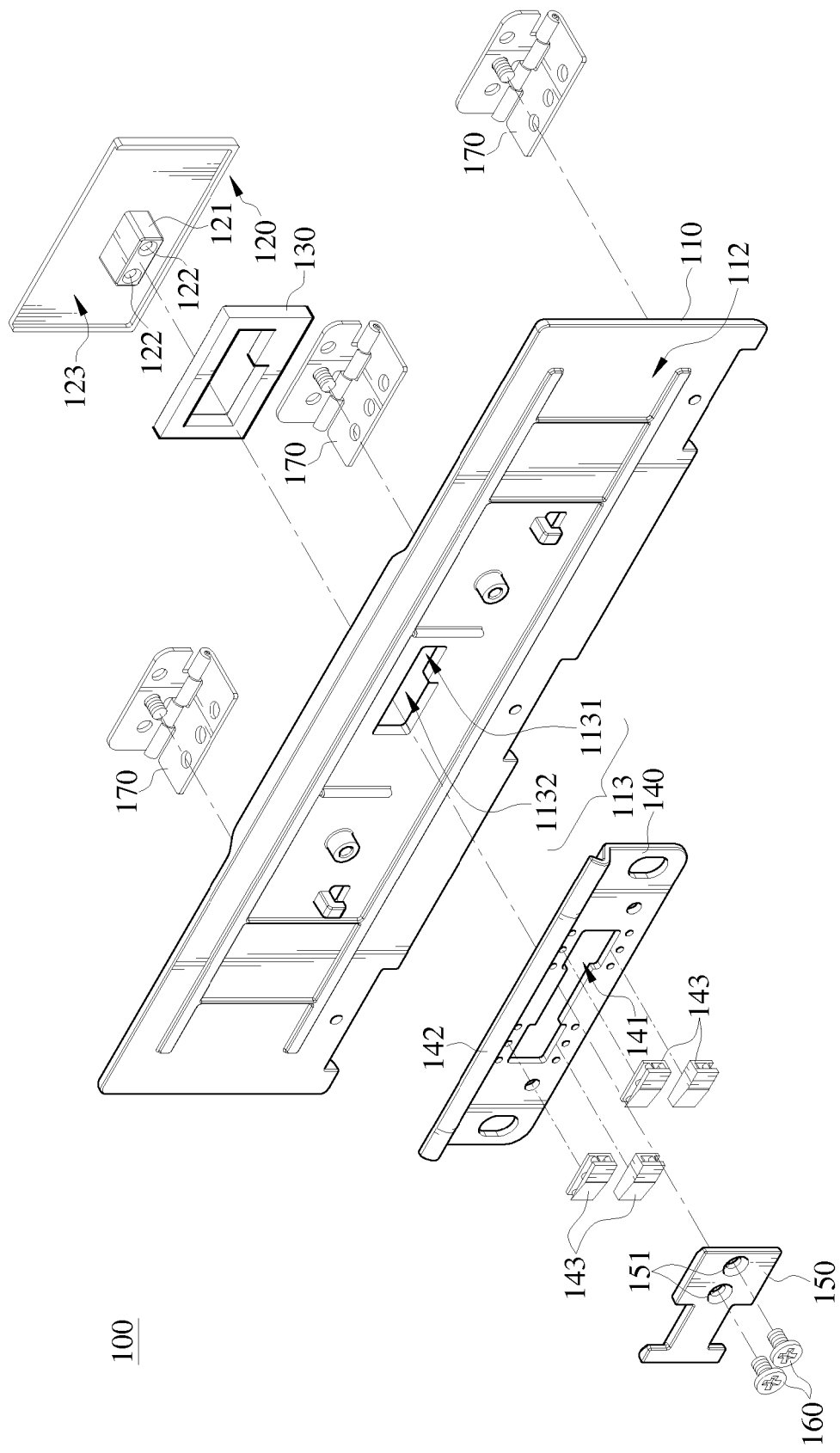
FIG. 1B is a three-dimensional exploded view of a lockable door structure according to an embodiment of the present invention.
Figure 2A:
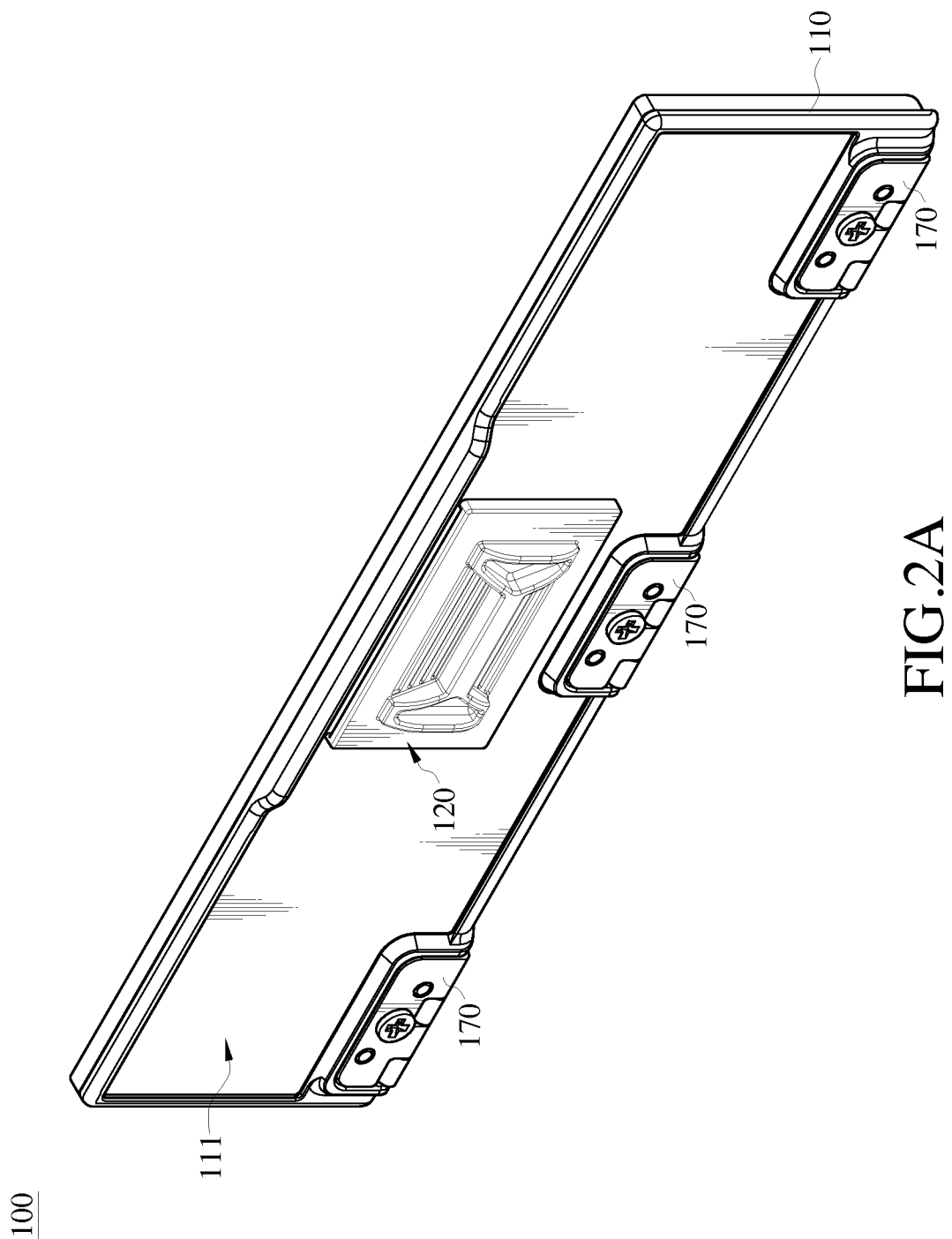
FIG. 2A is a schematic three-dimensional view of a lockable door structure according to an embodiment of the present invention.
Figure 2B:
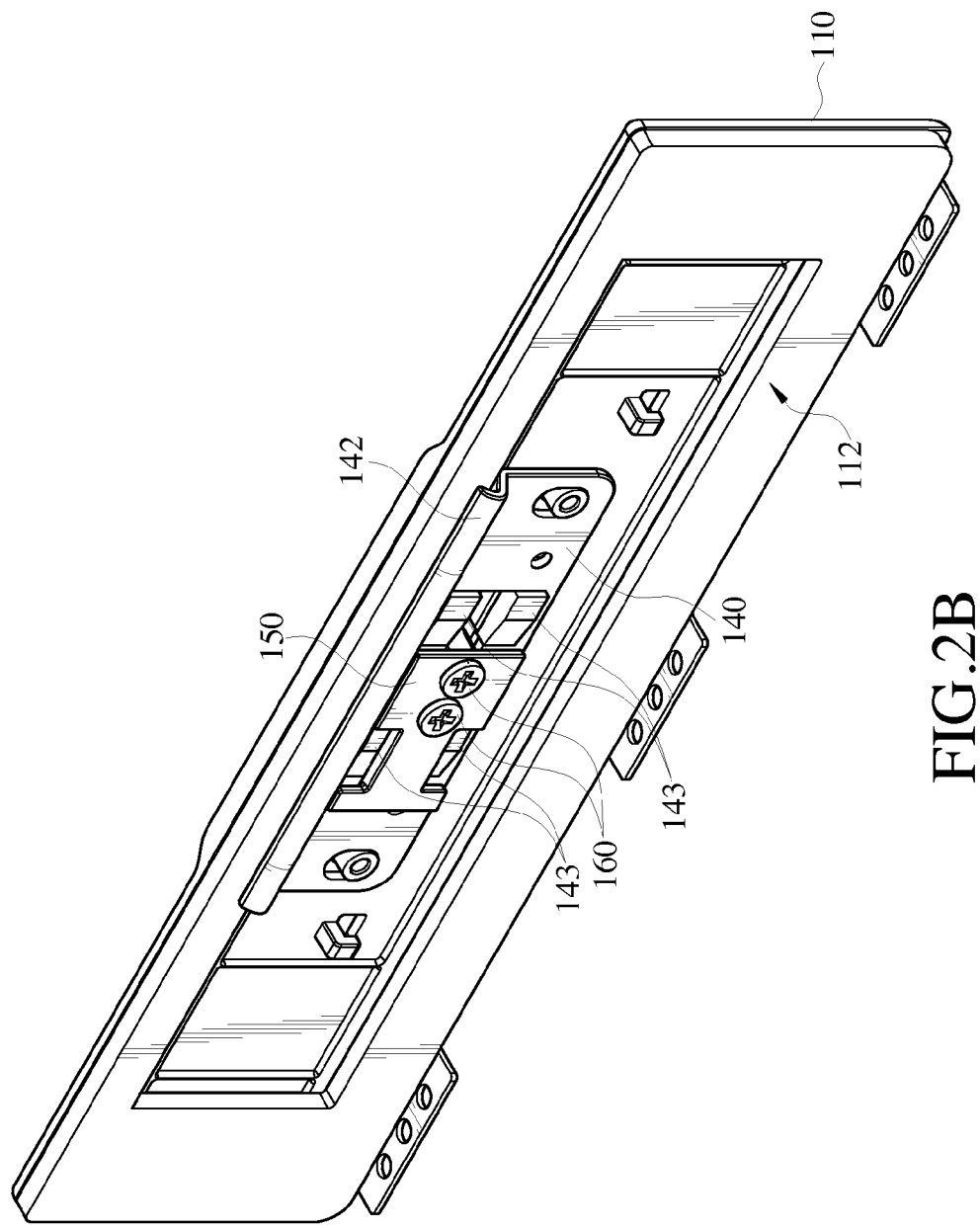
FIG. 2B is a schematic three-dimensional view of a lockable door structure according to an embodiment of the present invention.
Figure 4A:
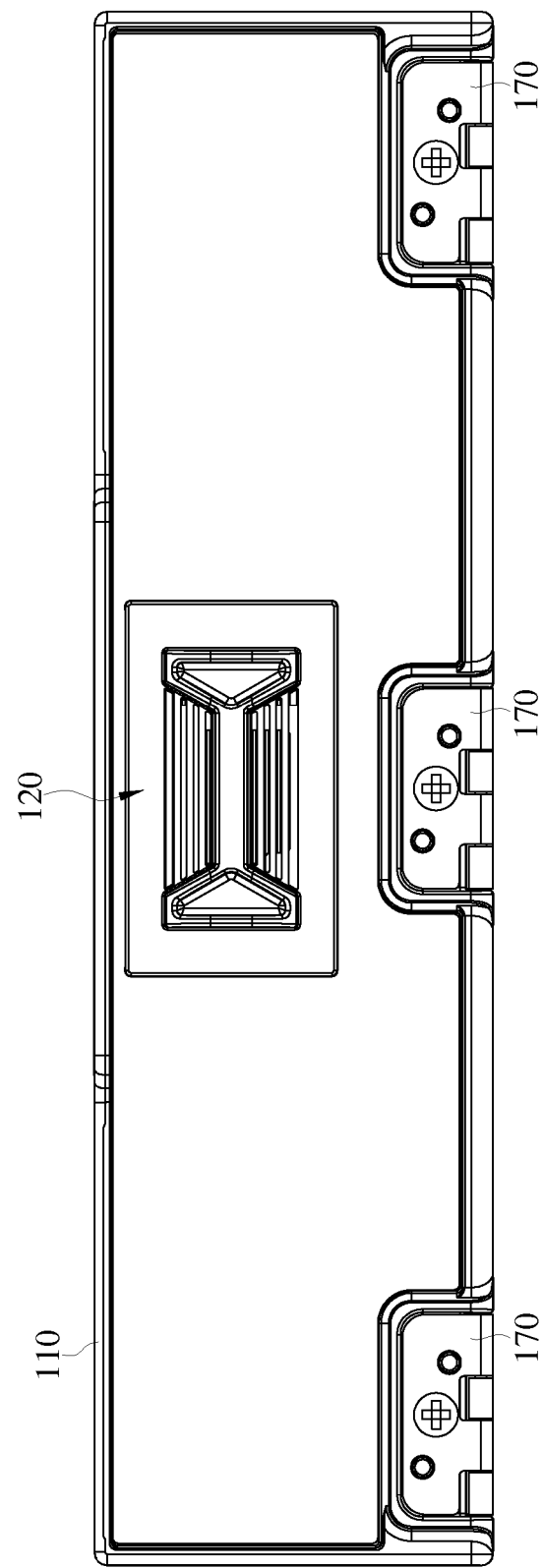
FIG. 4A is a schematic plane view of a first sliding member in a normal position according to an embodiment of the present invention.
Figure 4B:
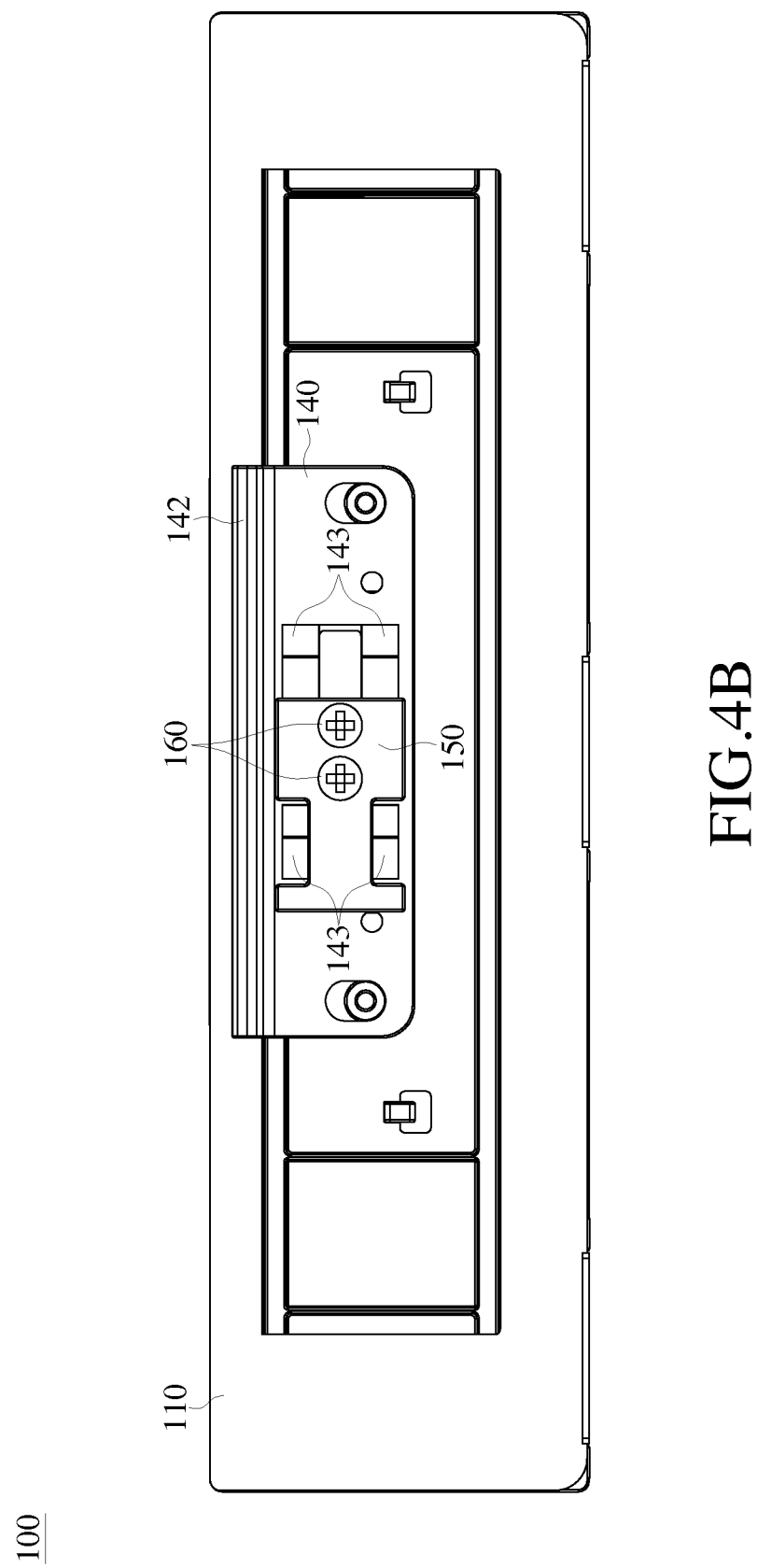
FIG. 4B is a schematic plane view of a first sliding member in a normal position according to an embodiment of the present invention.
Figure 4C:
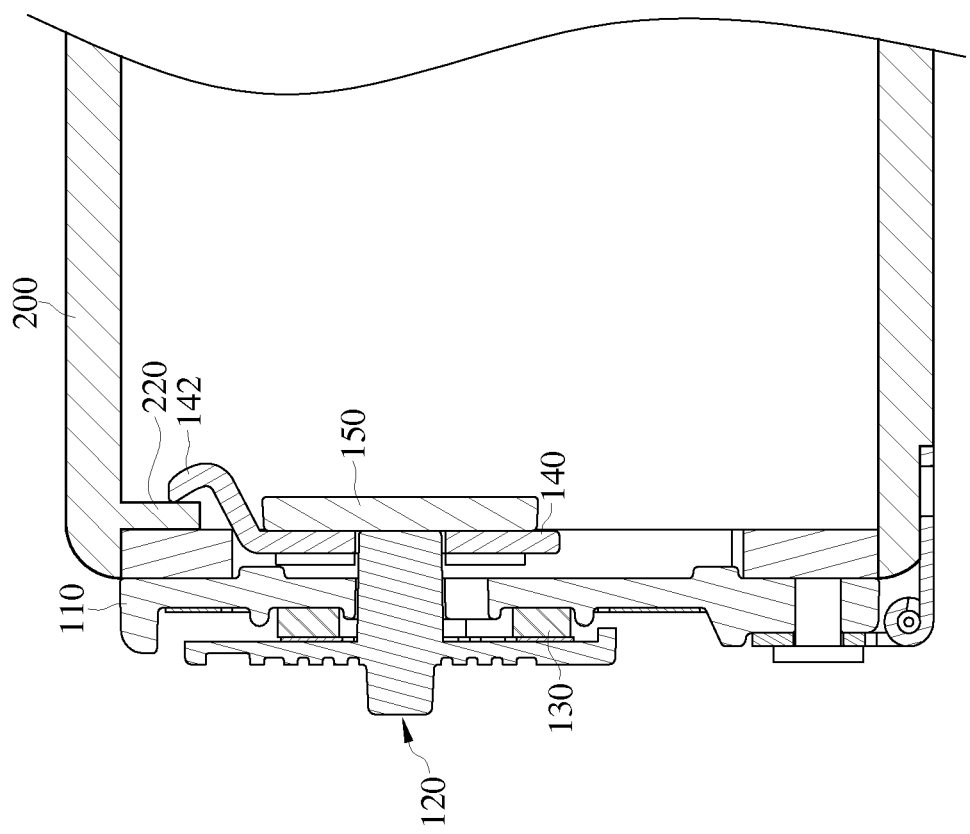
FIG. 4C is a sectional side view of a first sliding member in a normal position according to an embodiment of the present invention.
Figure 4D:
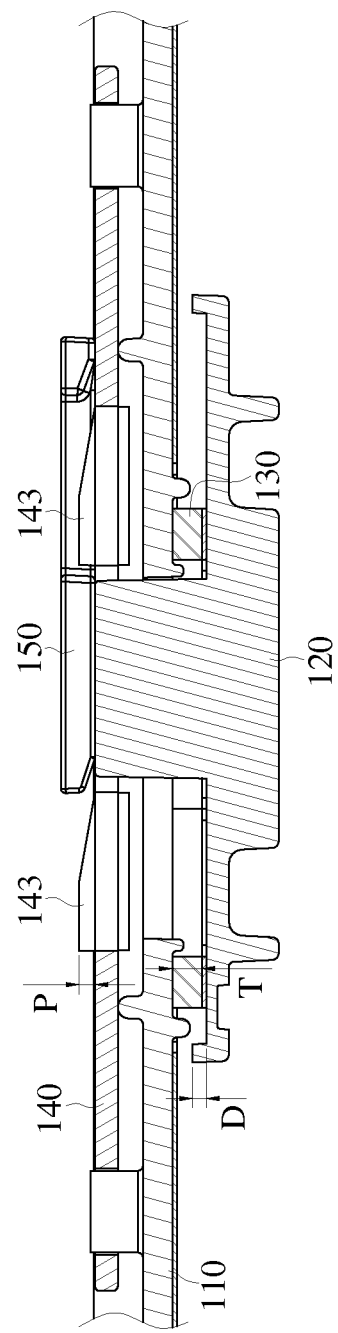
FIG. 4D is a sectional top view of a first sliding member in a normal position according to an embodiment of the present invention.

FIGS. 1A to 3 are schematic three-dimensional views of an embodiment of the present invention. As shown in the figures, in the present invention, a lockable door structure 100 is mounted on a case 200 of an electronic device. A sidewall on a keyboard side of the case 200 forms an opening 210, and a locking rib 220 is disposed in a position inside the case 200 and near the opening 210.

As shown in FIGS. 1A to 2B, the lockable door structure 100 comprises a door cover 110, a first sliding member 120, a fastening member 140, and a second sliding member 150. The door cover 110 is substantially a long rectangular plate. The door cover 110 has a first face 111 (that is, an external side surface of the door cover 110) and a second surface 112 (an internal side surface of the door cover 110) opposite to each other. The door cover 110 forms a displacement slot 113, which runs through the first surface 111 and the second surface 112.

The door cover 110 is hinged to the case 200 through hinges 170, and corresponds to the opening 210. The door cover 110 can selectively cover the opening 210 tightly to prevent external water and dust from entering into the inside of the case 200 through the opening 210. Alternatively, the door cover 110 selectively can be opened, so that an external peripheral device, such as a floppy disk, a hard disk driver (HDD), and an optical disk driver (ODD), can be installed into the case 200 through the opening 210.

Referring to FIGS. 1A to 2B, the first sliding member 120 is substantially a rectangular small plate. The first sliding member 120 has a joint portion 121 protruding from one side surface thereof. The side surface of the first sliding member 120 having the joint portion 121 has a receiving slot 123 recessed therein. The joint portion 121 forms at least one mounting hole 122. The first sliding member 120 is slidably mounted on the first surface 111 of the door cover 110, and the first sliding member 120 is inserted through the displacement slot 113 of the door cover 110 through the joint portion 121.

Specifically, the first sliding member 120 can slide relative to the door cover 110 between a normal position, a release position, and a retaining position. The displacement slot 113 of the door cover 110 has a stop portion 1131 and a release portion 1132. A position of the stop portion 1131 corresponds to the normal position and the retaining position, and a position of the release portion 1132 corresponds to the release position. In this embodiment, the displacement slot 113 is in the shape of L, and the normal position, the release position, and the retaining position also assume the shape of L. A relative relation of the first sliding member 120 being in the normal position, the release position, and the retaining position respectively is described later.

Referring to FIGS. 1A to 2B, the fastening member 140 is a piece of long rectangular sheet metal. The fastening member 140 may be slidably mounted on the second surface 112 of the door cover 110. Specifically, the fastening member 140 has a sliding slot 141, a catch portion 142, and at least one protrusion 143. The sliding slot 141 runs through the fastening member 140. The sliding slot 141 partially overlaps the displacement slot 113. The joint portion 121 of the first sliding member 120 is inserted through the sliding slot 141, and the joint portion 121 can slide in the sliding slot 141 relatively. The catch portion 142 is disposed on a long side edge at the top of the fastening member 140, and selectively catches the locking rib 220 of the case 200. The protrusion 143 is of a spring leaf structure, one end of the protrusion 143 is connected to one side surface of the fastening member 140 by, for example, sticking, locking, or welding, and the other end of the protrusion 143 is suspended above the fastening member 140, so that the protrusion 143 may be elastically compressed relative to the main body of the fastening member 140.

Figure 7:
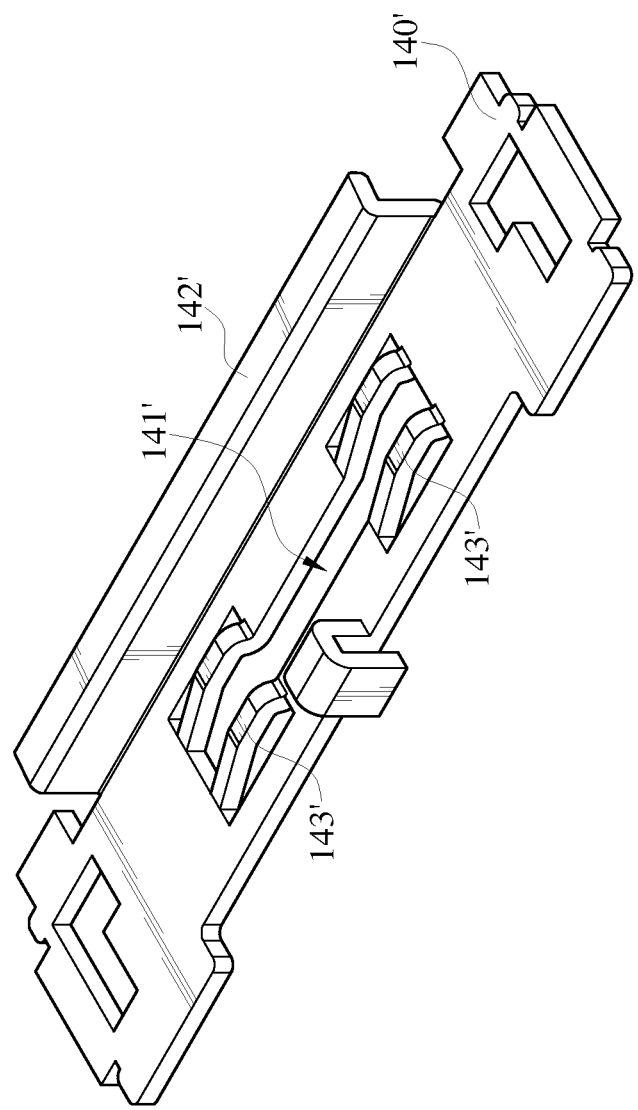
FIG. 7 is a schematic structural view of another embodiment of a fastening member according to the present invention.

Although in this embodiment, the protrusion 143 is connected to one side surface of the fastening member 140 by, for example, sticking, locking, or welding, this embodiment is not used to limit a method for forming the protrusion 143. FIG. 7 is a schematic structural view of another embodiment of a fastening member according to the present invention. According to other embodiments of the present invention, the fastening member 140 in FIGS. 1A to 2B may be replaced by a fastening member 140' shown in FIG. 7. The fastening member 140' has a sliding slot 141', a catch portion 142', and at least one protrusion 143'. The sliding slot 141' runs through the fastening member 140'. The joint portion 121 of the first sliding member 120 is inserted through the sliding slot 141', and the joint portion 121 can slide in the sliding slot 141' relatively. The catch portion 142' is disposed on a long side edge at the top of the fastening member 140', and selectively catches the locking rib 220 of the case 200. The protrusion 143' and the fastening member 140' are integrally formed. For example, the fastening member 140' in this embodiment is made of, for example, metal, and in this embodiment, the fastening member 140' is sheet-metal processed, so that the protrusion 143' protrudes from one side surface of the fastening member 140'.

In addition, besides the above method in which the fastening member 140' is sheet-metal processed, in order to control the shape of the protrusion more accurately, according to another embodiment of the present invention, the producing portion may further be formed on the fastening member by plastic injection molding. Referring to FIG. 8A and FIG. 8B, FIG. 8A is a schematic structural view of another embodiment of a fastening member according to the present invention, and FIG. 8B is a schematic exploded view corresponding to FIG. 8A. Similarly, according to other embodiments of the present invention, the fastening member 140 in FIGS. 1A to 2B may be replaced by a fastening member 140" shown in FIG. 8A. The fastening member 140" has a sliding slot 141", a catch portion 142", and at least one protrusion 143". The sliding slot 141" runs through the fastening member 140". The joint portion 121 of the first sliding member 120 is inserted through the sliding slot 141", and the joint portion 121 can slide in the sliding slot 141" relatively. The catch portion 142" is disposed on a long side edge at the top of the fastening member 140", and selectively catches the locking rib 220 of the case 200. The protrusion 143" is made of, for example, plastic, the fastening member 140" is made of, for example, metal, and in this embodiment, the protrusion 143" is formed on one side surface of the fastening member 140" by injection molding. Compared with the method shown in FIG. 7 in which the protrusion 143' is formed by sheet-metal processing, in this embodiment, the protrusion 143" is formed by the injection molding, so that according to this embodiment, the shape and size of the protrusion 143" can be controlled more accurately.

As shown in FIGS. 1A to 2B, the second sliding member 150 is a sheet metal, and is slidably disposed on the other side surface of the fastening member 140 facing the door cover 110. The second sliding member 150 has at least one through hole 151, and the number of the through hole 151 corresponds to the number of the mounting hole 122 of the joint portion 121. A fixing component 160 having the same number with through hole 151, for example, a screw or a bolt, is inserted through the through hole 151, and is combined to the mounting hole 122, so that the second sliding member 150 is fixed on the joint portion 121 of the first sliding member 120, and the second sliding member 150 and the first sliding member 120 may slide in a synchronized manner.

FIGS. 4A to 4D are schematic plane views of the first sliding member 120 in a normal position according to the present invention.

When the first sliding member 120 is in the normal position, the joint portion 121 of the first sliding member 120 is in the stop portion 1131 of the displacement slot 113, and the joint portion 121 does not press the fastening member 140 to move. The second sliding member 150 is on a plane of the fastening member 140, and is not moved to be on the protrusion 143. A torsion spring (not shown) connected to the fastening member 140 may exert a force upwards, so that the catch portion 142 of the fastening member 140 catches the locking rib 220 of the case 200 normally, thus preventing the door cover 110 from pivoting relative to the case 200.

Through the torsion spring, the catch portion 142 of the fastening member 140 normally catches the locking rib 220, which is not the technical focus of the present invention, and is not described herein by the applicants. Persons skilled in the art may use any suitable method to keep the fastening member 140 in a normal catching state, which is not limited by this embodiment.

Figure 5A:
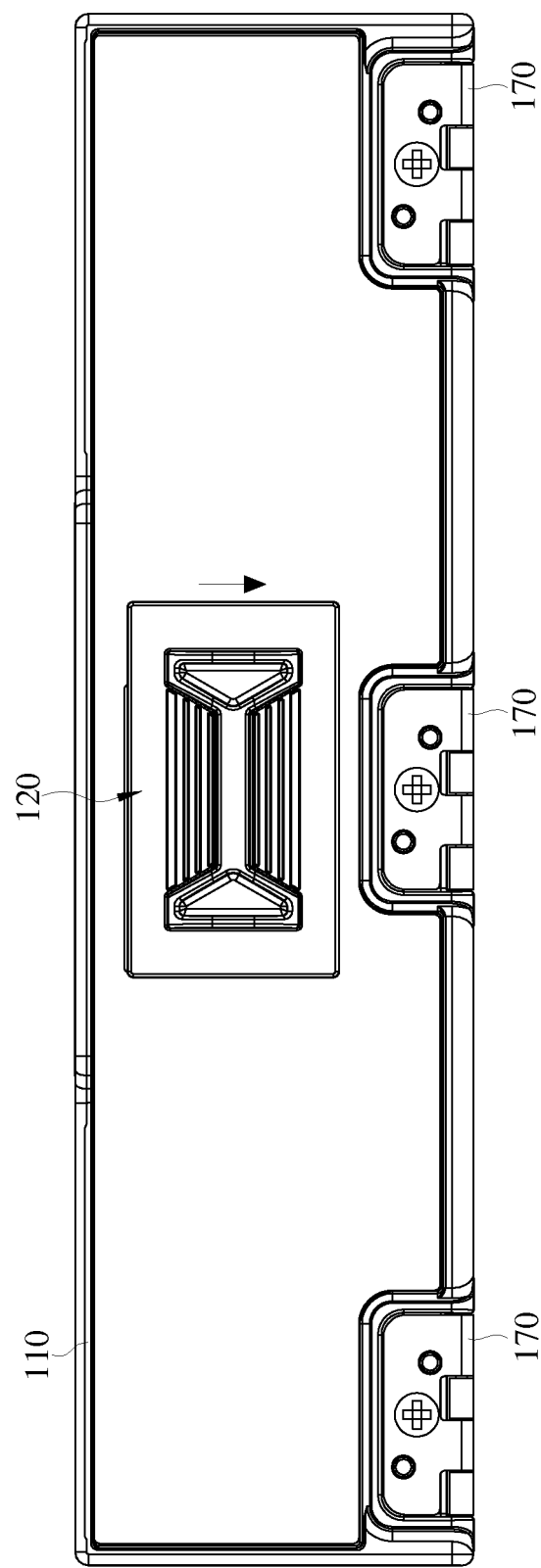
FIG. 5A is a schematic plane view of a first sliding member in a release position according to an embodiment of the present invention.
Figure 5B:
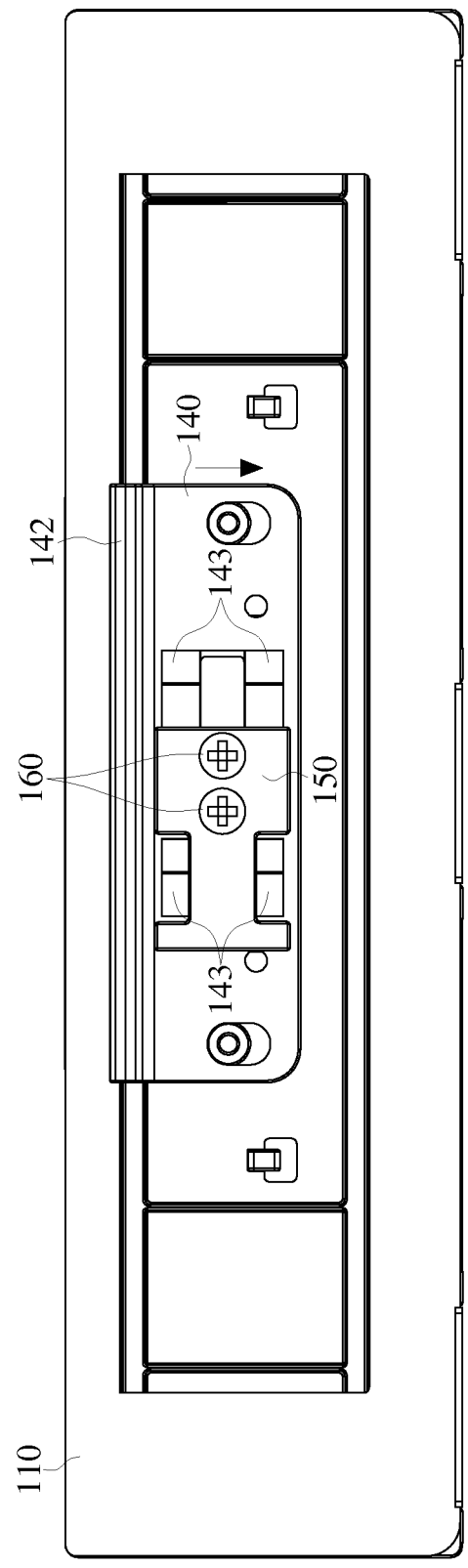
FIG. 5B is a schematic plane view of a first sliding member in a release position according to an embodiment of the present invention.
Figure 5C:
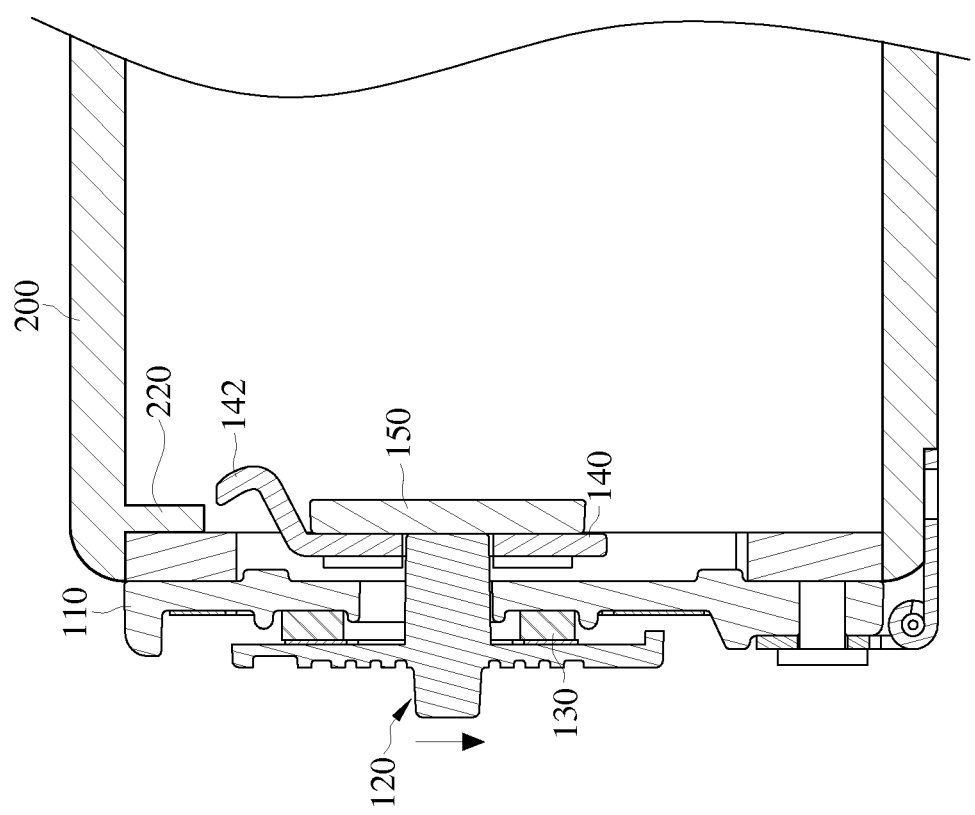
FIG. 5C is a sectional side view of a first sliding member in a release position according to an embodiment of the present invention.
Figure 6A:
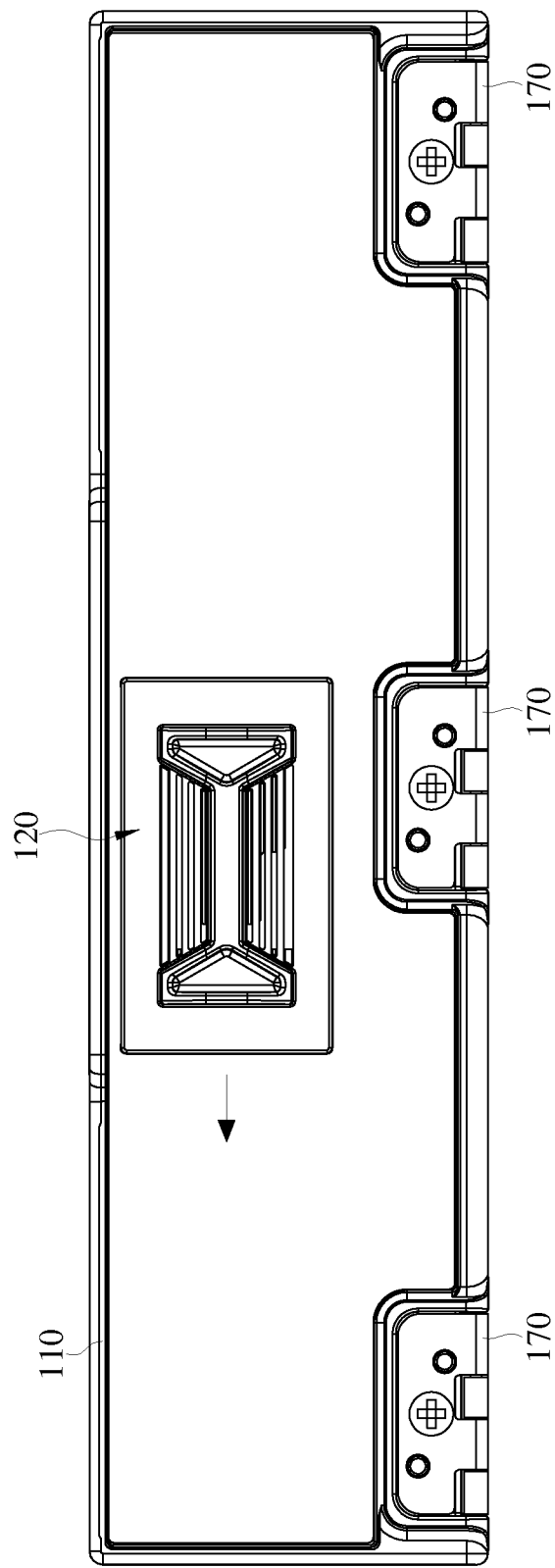
FIG. 6A is a schematic plane view of a first sliding member in a retaining position according to an embodiment of the present invention.
Figure 6B:
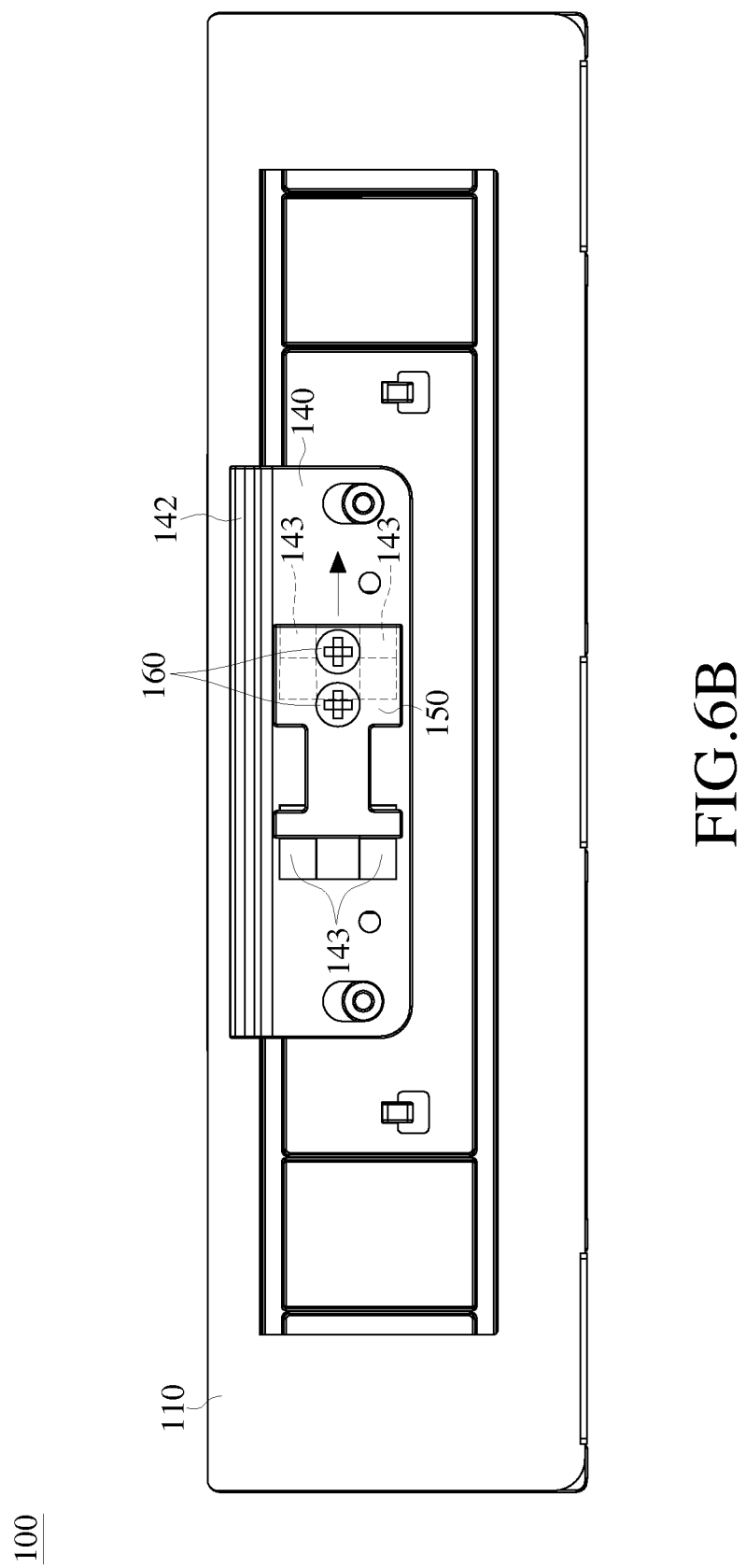
FIG. 6B is a schematic plane view of a first sliding member in a retaining position according to an embodiment of the present invention.
Figure 6D:
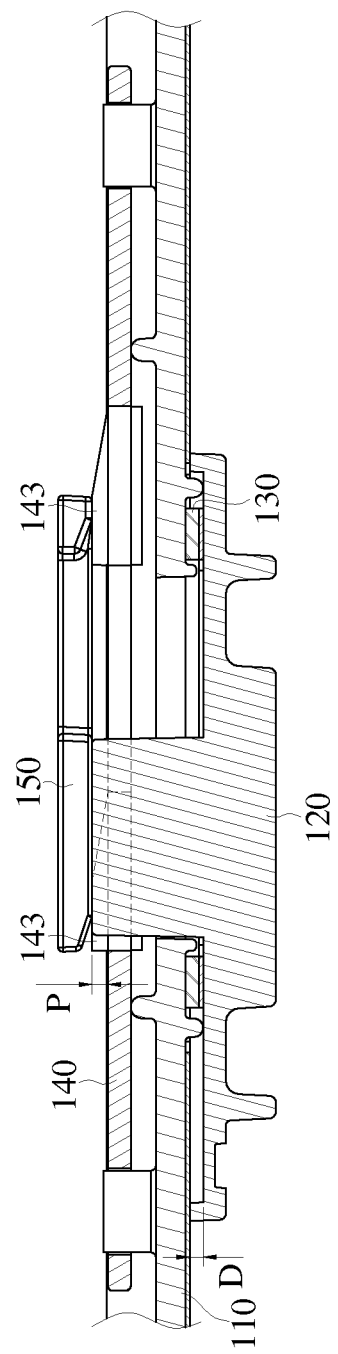
FIG. 6D is a sectional top view of a first sliding member in a retaining position according to an embodiment of the present invention.

FIGS. 5A to 5C are schematic plane views of the first sliding member 120 in a release position according to the present invention.

When an operator exerts a force downwards to the first sliding member 120, the first sliding member 120 slides to a release position along a vertical direction, the joint portion 121 of the first sliding member 120 is moved in the release portion 1132 of the displacement slot 113, and meanwhile, the joint portion 121 presses a wall of the sliding slot 141 to make the fastening member 140 move. The second sliding member 150 is also on the plane of the fastening member 140, and is not moved to be on the protrusion 143. At the moment, the catch portion 142 of the fastening member 140 departs from the locking rib 220 of the case 200, so that the door cover 110 can pivot freely relative to the case 200.

FIGS. 6A to 6D are schematic plane views of the first sliding member 120 in a retaining position according to the present invention.

When the first sliding member 120 is in the normal position, and the operator exerts a force in a horizontal direction to the first sliding member 120, the first sliding member 120 slides to a retaining position along the horizontal direction. At the moment, the joint portion 121 of the first sliding member 120 is in the stop portion 1131 of the displacement slot 113, and the joint portion 121 does not press the fastening member 140 to move. The second sliding member 150 moves from a lateral side of the protrusion 143 to be on the protrusion 143 of the fastening member 140 along with the movement of the first sliding member 120. Since the second sliding member 150 moves in a direction perpendicular to the door cover 110, the first sliding member 120 is linked to the second sliding member 150 to be forced to move in the same direction (that is, the direction towards the second sliding member 150), so that the second sliding member 150 is pressed by the protrusion 143 to drive the first sliding member 120 to press against the door cover 110, and join the door cover 110 tightly.

In addition, in order to further enhance the tightness between the first sliding member 120 and the door cover 110, the lockable door structure 100 shown in FIGS. 1A to 2B may further comprise a seal member 130. The seal member 130 is partially embedded in the receiving slot 123 of the first sliding member 120. A part of the seal member 130 exposed from the first sliding member 120 contacts with the door cover 110. That is to say, the seal member 130 is sandwiched between the door cover 110 and the first sliding member 120, and the seal member 130 contacts with the door cover 110 and the first sliding member 120.

The seal member 130 is made of an elastic material, so that the seal member 130 can be elastically compressed and deformed. The seal member 130 is made of, for example, a foam material. In this embodiment, NanNex TL Series TL4403, heat resistant and difficult to burn, is used for making the seal member 130, but the present invention is not limited thereto. Persons skilled in the art may select a suitable elastic material to make the seal member 130 according to actual needs.

Therefore, when the first sliding member 120 slides from the normal position to the retaining position along the horizontal direction, the first sliding member 120 presses the seal member 130 to the door cover 110 to deform the seal member 130. Therefore, the design comprising the seal member 130 can improve tightness between the first sliding member 120 and the door cover 110.

It should be noted that, the receiving slot 123 of the first sliding member 120 has a depth distance D, the protrusion 143 of the fastening member 140 has a protruding distance P, and an interference I between the first sliding member 120 and the seal member 130 is a sum of the depth distance D and the protruding distance P. The seal member 130 has a thickness T, a compression deformation percentage C is generated by the deformation of the pressed seal member 130, and the compression deformation percentage C is a value obtained by the interference I/the thickness T.

For example, in this embodiment, the thickness T of the seal member 130 is 2 mm, and taking the seal member 130 made of the NanNex TL4403 for example, a percentage of elongation of the seal member 130 is 48%, and in this embodiment, the depth distance D of the receiving slot 123 is 0.5 mm, and the protruding distance P of the protrusion 143 is 0.7 mm. Therefore, the interference I between the first sliding member 120 and the seal member 130 is 1.2 mm. The compression deformation percentage C of the seal member 130 is 60%, which is much greater than 48%, the preset percentage of elongation of the seal member 130. Pores inside the seal member 130 are eliminated by pressing the seal member 130, and outside water cannot pass through the seal member 130 to enter into the case 200. Thus, the seal member 130 can effectively provide the high tightness between the first sliding member 120 and the door cover 110.

In view of the above, in the present invention, the catch portion of the fastening member is designed, so that when the first sliding member slides to the retaining position, the interference between the first sliding member and the seal member is increased, thus further enhancing the pressing force from the first sliding member to the seal member to effectively increase the tightness between the first sliding member and the door cover.

In addition, when the first sliding member slides between the normal position and the release position, the catch portion does not increase the interference between the first sliding member and the seal member, and the operation of the first sliding member is not affected, so that the lockable door structure of the present invention is not only waterproof but also convenient for use.

What is claimed is:

1. A lockable door structure, disposed on a case, wherein the case has an opening, and the case has a locking rib in a position adjacent to the opening, the lockable door structure comprising: a door cover, hinged to the case and corresponding to the opening, wherein the door cover has a first surface and a second surface opposite to each other, and the door cover has a displacement slot running through the first surface and the second surface;
   a first sliding member, slidably mounted on the first surface of the door cover, wherein the first sliding member slides relative to the door cover among a normal position, a release position, and a retaining position;
   a fastening member, slidably mounted on the second surface of the door cover, wherein the fastening member has a sliding slot, a catch portion, and at least one protrusion; and
   a second sliding member, slidably disposed on the fastening member, wherein the first sliding member passes through the displacement slot and the sliding slot to join and be directly fixed to the second sliding member such that the first sliding member and the second sliding member slide in a synchronized manner;
   configured such that:
     when the first sliding member is in the normal position, the catch portion catches the locking rib, and the second sliding member is located on a lateral side of the protrusion,
     when the first sliding member moves from the normal position to the release position, the first sliding member moves in the displacement slot, and presses a wall of the sliding slot to make the catch portion depart from the locking rib, and
     when the first sliding member moves from the release position to the retaining position, the first sliding member moves in the displacement slot to drive the second sliding member to move from the lateral side of the protrusion to be on the protrusion, so that the second sliding member is pressed by the protrusion to drive the first sliding member to press towards the first surface of the door cover.

2. The lockable door structure according to claim 1, further comprises a seal member, sandwiched between the door cover and the first sliding member.

3. The lockable door structure according to claim 2, wherein the first sliding member further has a receiving slot, and the seal member is partially embedded in the receiving slot.

4. The lockable door structure according to claim 3, wherein the receiving slot has a depth distance, the protrusion has a protruding distance, an interference between the first sliding member and the seal member is a sum of the depth distance and the protruding distance, the seal member has a thickness and a compression deformation percentage, and the compression deformation percentage is the interference/the thickness.

5. The lockable door structure according to claim 4, wherein the compression deformation percentage of the seal member is at least 48%.

6. The lockable door structure according to claim 5, wherein the depth distance of the receiving slot is 0.5 mm, the protruding distance of the protrusion is 0.7 mm, the interference between the first sliding member and the seal member is 1.2 mm, and the thickness of the seal member is 2 mm.

7. The lockable door structure according to claim 2, wherein the seal member is made of an elastic material.

8. The lockable door structure according to claim 7, wherein the seal member is made of a foam material.

9. The lockable door structure according to claim 1, wherein the normal position, the release position, and the retaining position follow a path that is arranged in an L shape pattern.

10. The lockable door structure according to claim 9, wherein the first sliding member includes a joint portion passing through the displacement slot and the sliding slot and connected to the second sliding member, wherein the joint portion is slideable relative to the sliding slot.

11. The lockable door structure according to claim 10, wherein movement of the first sliding member in to the release position drives the joint portion to press a wall of the sliding slot and drive the fastening member to move.

12. The lockable door structure according to claim 11, wherein movement of the first sliding member to the retaining position does not drive the fastening member to move.

13. The lockable door structure according to claim 1, wherein the first sliding member further has a joint portion, which is inserted through the displacement slot and the sliding slot to make the first sliding member slide relative to the door cover, and the second sliding member is connected to the joint portion.

14. The lockable door structure according to claim 1, wherein the displacement slot further has a stop portion and a release portion connected to each other, a position of the stop portion corresponds to the normal position and the retaining position, and a position of the release portion corresponds to the release position.

15. The lockable door structure according to claim 1, wherein the protrusion is a spring structure, a first end of the protrusion is connected to the fastening member, and a second end of the protrusion is suspended above the fastening member.

16. The lockable door structure according to claim 1, wherein the displacement slot partially overlaps the sliding slot.

17. The lockable door structure according to claim 1, wherein the second sliding member is disposed on a side of the fastening member opposite to the first sliding member.

* * * * *